(12) United States Patent
Wang et al.

(10) Patent No.: US 12,310,104 B2
(45) Date of Patent: May 20, 2025

(54) FULL-REFLECTION DISPLAY SUBSTRATE, MANUFACTURING METHOD THEREOF AND FULL-REFLECTION DISPLAY DEVICE

(71) Applicant: BOE Technology Group Co., Ltd., Beijing (CN)

(72) Inventors: Jiguo Wang, Beijing (CN); Jian Sun, Beijing (CN); Jiantao Liu, Beijing (CN)

(73) Assignee: Technology Group Co., Ltd., Beijing (CN)

( * ) Notice: Subject to any disclaimer, the term of this patent is extended or adjusted under 35 U.S.C. 154(b) by 675 days.

(21) Appl. No.: 17/624,878

(22) PCT Filed: Apr. 15, 2021

(86) PCT No.: PCT/CN2021/087469
§ 371 (c)(1),
(2) Date: Jan. 5, 2022

(87) PCT Pub. No.: WO2021/227765
PCT Pub. Date: Nov. 18, 2021

(65) Prior Publication Data
US 2022/0285406 A1    Sep. 8, 2022

(30) Foreign Application Priority Data
May 13, 2020  (CN) .......................... 202010402256.0

(51) Int. Cl.
*H10K 59/80*    (2023.01)
*H10D 86/01*    (2025.01)
(Continued)

(52) U.S. Cl.
CPC ....... *H10D 86/0231* (2025.01); *H10D 86/451* (2025.01); *A23B 2/20* (2025.01);
(Continued)

(58) Field of Classification Search
CPC ............ H01L 27/1248; H10K 59/1201; H10K 59/122; H10K 59/123; H10K 59/124;
(Continued)

(56) References Cited

U.S. PATENT DOCUMENTS 6,713,310 B2 *  3/2004  Song ...................... H10B 53/30
                                                       257/E21.664
9,450,156 B2 *  9/2016  Park ...................... H01L 33/641
(Continued)

FOREIGN PATENT DOCUMENTS

CN    101676781 A    3/2010
CN    102403311 A    4/2012
(Continued)

OTHER PUBLICATIONS

IEEE Xplore search.*
PCT/CN2021/087469 international search report and written opinion.

*Primary Examiner* — Eduardo A Rodela

(57) ABSTRACT

The present disclosure provides a full-reflection display substrate, a manufacturing method thereof and a full-reflection display device. The full-reflection display substrate includes: a base substrate, the base substrate including a display region and a non-display region; a signal line arranged in the display region; a bonding pin arranged in the non-display region, coupled to the signal line and bonded to a driving circuitry; a reflection layer arranged in the display region; and an etch stop pattern arranged at a same layer and (Continued)

made of a same material as the reflection layer, arranged in the non-display region, and at least covering a side surface of the bonding pin.

11 Claims, 4 Drawing Sheets

(51) Int. Cl.
*H10D 86/40* (2025.01)
*H10K 59/123* (2023.01)
*A23B 2/20* (2025.01)
*A23B 11/86* (2025.01)
*C01G 45/022* (2025.01)
*H10D 10/80* (2025.01)

(52) U.S. Cl.
CPC ............ *A23B 11/86* (2025.01); *C01G 45/022* (2025.01); *H10D 10/821* (2025.01)

(58) Field of Classification Search
CPC .. H10K 59/126; H10K 59/131; H10K 59/179; H10K 59/80518; H10K 59/82; H10D 86/60; H10D 86/0231; H10D 86/443; H10D 86/451
See application file for complete search history.

(56) References Cited

U.S. PATENT DOCUMENTS

| | | | |
|---|---|---|---|
| 10,297,772 B2 * | 5/2019 | Lee | H10K 59/122 |
| 11,424,312 B2 * | 8/2022 | Baek | H10K 59/124 |
| 11,557,614 B2 * | 1/2023 | Kim | H01L 27/124 |
| 11,574,970 B2 * | 2/2023 | Kim | H10K 59/124 |
| 11,652,111 B2 * | 5/2023 | Choung | H01L 27/124 |
| | | | 257/749 |
| 11,910,659 B2 * | 2/2024 | Baek | H10K 50/865 |
| 2016/0322399 A1 | 11/2016 | Kim et al. | |
| 2021/0210527 A1 | 7/2021 | Bai et al. | |
| 2021/0343811 A1 * | 11/2021 | Kim | H10K 59/124 |
| 2022/0181411 A1 * | 6/2022 | Kim | H10K 59/1213 |
| 2023/0180537 A1 * | 6/2023 | Jung | H10K 50/15 |
| | | | 257/40 |

FOREIGN PATENT DOCUMENTS

| | | |
|---|---|---|
| CN | 106941093 A | 7/2017 |
| CN | 110931540 A | 3/2020 |
| CN | 111554696 A | 8/2020 |
| JP | 2001127303 A | 5/2001 |

* cited by examiner

FULL-REFLECTION DISPLAY SUBSTRATE, MANUFACTURING METHOD THEREOF AND FULL-REFLECTION DISPLAY DEVICE

CROSS-REFERENCE TO RELATED APPLICATION

This application is the U.S. national phase of PCT application No. PCT/CN2021/087469 filed on Apr. 15, 2021, which claims a priority of the Chinese patent application No. 202010402256.0 filed on May 13, 2020, the entire contents of which are incorporated herein by reference.

TECHNICAL FIELD

The present disclosure relates to the field of display technology, in particularly to a full-reflection display substrate, a manufacturing method thereof and a full-reflection display device.

BACKGROUND

Full-reflection display device depends on external environment light for display without a backlight source, and has such advantages as low power consumption, low cost and being capable of used to display an image in multiple colors, so it has gradually replaced traditional ink-type electronic paper in such fields as intelligent retail, Electronic Shelf Label (ESL) and E-book.

A display substrate of the full-reflection display device includes a display region and a non-display region, and the non-display region generally surrounds the display region. A reflection layer is arranged in the display region, a bonding pin is arranged in the non-display region, and the bonding pin is coupled to a signal line in the display region and bonded to a driving Integrated Circuit (IC), so as to connect the driving IC and the signal line.

Generally, the bonding pin includes at least one metal film layer. After the formation, the bonding pin is exposed. A wet-etching process is required in the subsequent formation of the reflection layer, so the bonding pin will be etched by an etching solution. At this time a bonding defect may occur, and signal transmission may be adversely affected, thereby a display defect may occur.

SUMMARY

An object of the present disclosure is to provide a full-reflection display substrate, a manufacturing method thereof and a full-reflection display device, so as to solve the problem in the related art where a bonding defect occurs, signal transmission is adversely affected and thereby a display defect occurs when the bonding pin of the full-reflection display substrate is etched in a subsequent wet-etching process.

In order to solve the above technical problems, the present disclosure is implemented as follows.

In one aspect, the present disclosure provides in some embodiments a full-reflection display substrate, including: a base substrate, the base substrate including a display region and a non-display region; a signal line arranged in the display region; a bonding pin arranged in the non-display region, coupled to the signal line and bonded to a driving circuitry; a reflection layer arranged in the display region; and an etch stop pattern arranged at a same layer and made of a same material as the reflection layer, arranged in the non-display region, and at least covering a side surface of the bonding pin.

In a possible embodiment of the present disclosure, the etch stop pattern completely covers the bonding pin.

In a possible embodiment of the present disclosure, each of the reflection layer and the etch stop pattern includes at least one metal film layer and at least one transparent metal oxide film layer laminated one on another.

In a possible embodiment of the present disclosure, the etch stop pattern is provided with a first via hole to expose a part of the bonding pin.

In a possible embodiment of the present disclosure, the first via hole is arranged in a flat region of the etch stop pattern.

In a possible embodiment of the present disclosure, the bonding pin includes a first metal layer pattern and a second metal layer pattern, the first metal layer pattern and the second metal layer pattern are coupled to each other through a second via hole in an interlayer dielectric layer between the first metal layer pattern and the second metal layer pattern, and an orthogonal projection of the first via hole onto the base substrate does not overlap an orthogonal projection of the second via hole onto the base substrate.

In a possible embodiment of the present disclosure, the reflection layer is reused as a pixel electrode.

In another aspect, the present disclosure provides in some embodiments a full-reflection display device, including the above-mentioned full-reflection display substrate.

In yet another aspect, the present disclosure provides in some embodiments a method for manufacturing a full-reflection display substrate, including: providing a base substrate, the base substrate including a display region and a non-display region; forming a signal line in the display region and forming a bonding pin in the non-display region, the bonding pin being coupled to the signal line and bonded to a driving circuitry; forming a first conductive film layer on the base substrate, the first conductive film layer covering the display region and the non-display region; forming a first photoresist pattern and a second photoresist pattern on the first conductive film layer, the first photoresist pattern being arranged in the display region, and the second photoresist pattern being arranged in the non-display region; wet-etching the first conductive film layer with the first photoresist pattern and the second photoresist pattern as masks to obtain a reflection layer and an etch stop pattern, the reflection layer being arranged in the display region, and the etch stop pattern being arranged in the non-display region and at least covering a side surface of the bonding pin; and removing the first photoresist pattern and the second photoresist pattern.

In a possible embodiment of the present disclosure, subsequent to obtaining the reflection layer and the etch stop pattern, the method further includes forming a first via hole in the etch stop pattern to expose a part of the bonding pin.

In a possible embodiment of the present disclosure, the forming the first via hole in the etch stop pattern includes forming the first via hole in a flat region of the etch stop pattern.

According to the embodiments of the present disclosure, the etch stop pattern is reserved on at least the side surface of the bonding pin, so as to prevent the bonding pin from being etched during the formation of the reflection layer, and prevent the bonding pin from being scratched, thereby to improve the product stability.

BRIEF DESCRIPTION OF THE DRAWINGS

Through reading the detailed description hereinafter, the other advantages and benefits will be apparent to a person skilled in the art. The drawings are merely used to show the preferred embodiments, but shall not be construed as limiting the present disclosure. In addition, in the drawings, same reference symbols represent same members. In these drawings.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
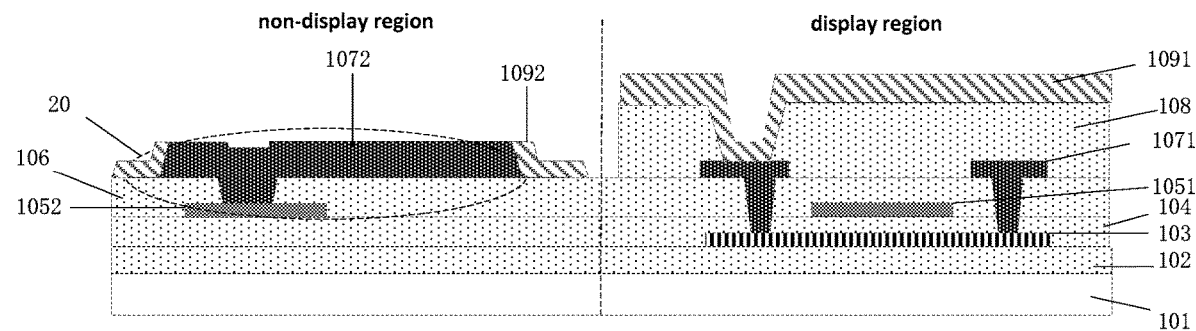
FIG. 1 is a schematic view showing a full-reflection display substrate according to one embodiment of the present disclosure.

The present disclosure provides in some embodiments a full-reflection display substrate which, as shown in FIG. 1, includes: a base substrate 101, the base substrate 101 including a display region and a non-display region; a signal line (not shown) arranged in the display region (e.g., a gate line, a data line or a touch electrode signal line); a bonding pin 20 arranged in the non-display region, coupled to the signal line, and bonded to a driving circuitry; a reflection layer 1091 arranged in the display region; and an etch stop pattern 1092 arranged at a same layer and made of a same material as the reflection layer 1091, arranged in the non-display region, and at least covering a side surface of the bonding pin 20.

According to the embodiments of the present disclosure, the etch stop pattern is reserved on at least the side surface of the bonding pin, so as to prevent the bonding pin from being etched during the formation of the reflection layer, and prevent the bonding pin from being scratched, thereby to improve the product stability (when a surface of the bonding pin is scratched in a machining process, signal-related defects may occur more easily in a subsequent reliability test).

Figure 2:
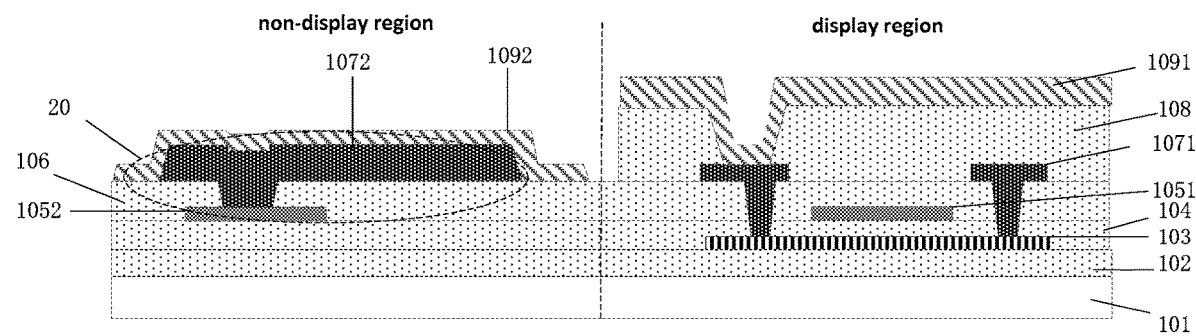
FIG. 2 is another schematic view showing the full-reflection display substrate according to one embodiment of the present disclosure.

In a possible embodiment of the present disclosure, as shown in FIG. 2, the etch stop pattern 1092 completely covers the bonding pin 20, so as to further improve the protection performance.

In the embodiments of the present disclosure, the bonding pin 20 includes one metal film layer or a plurality of metal film layers coupled to each other. For example, the bonding pin 20 includes a first metal layer pattern 1052 and a second metal layer pattern 1072, and the first metal layer pattern 1052 and the second metal layer pattern 1072 are coupled to each other through a second via hole in an interlayer dielectric layer between the first metal layer pattern 1052 and the second metal layer pattern 1072. In a possible embodiment of the present disclosure, the first metal layer pattern 1052 is a gate metal layer pattern, and it is arranged at a same layer and made of a same material as a gate electrode 1051 in the display region, so that the first metal layer pattern 1052 and the gate electrode 1051 are formed through a single patterning process. The second metal layer pattern 1072 is a source/drain metal layer pattern, and it is arranged at a same layer and made of a same material as a source/drain electrode 1071 in the display region, so that the second metal layer pattern 1072 and the source/drain electrode 1071 are formed through a single patterning process. Further, in a possible embodiment of the present disclosure, the signal line is arranged at a same layer and made of a same material as the first metal layer pattern 1052 and the gate electrode 1051, in the case that the signal line is a gate line. The signal line is arranged at a same layer and made of a same material as the second metal layer pattern 1072, the source/drain electrode 1071, in the case that the signal line is a data line.

In the embodiments of the present disclosure, the second metal layer pattern 1072 includes one metal film layer or a plurality of metal film layers laminated one on another. For example, the second metal layer pattern 1072 is a multi-layered structure consisting of a titanium (Ti) layer, an aluminum (Al) layer, and a Ti layer. Al is easily oxidized and Ti is hardly oxidized. Hence, through the two Ti layers at both sides of the Al layer respectively, it is able to prevent the Al layer from being oxidized.

In the embodiments of the present disclosure, each of the reflection layer 1091 and the etch stop pattern 1092 includes at least one metal film layer and at least one transparent metal oxide film layer laminated one on another, and the transparent metal oxide film layer is used to prevent the metal film layer from being oxidized. Furthermore, the etch stop pattern includes a first transparent metal oxide film layer, a metal film layer and a second transparent metal oxide film layer laminated one on another, that is, the transparent metal oxide film layers are arranged at two sides of the metal film layer respectively, so as to prevent the metal film layer from being oxidized in a better manner. For example, the reflection layer 1091 and the etch stop pattern 1092 may be a multi-layered structure consisting of an indium tin oxide (ITO) layer, a silver (Ag) layer, and an ITO layer. The Ag layer is easily oxidized, and when the ITO layers are arranged on and above the Ag layer, it is able to effectively prevent the Ag layer from being oxidized.

Figure 3:
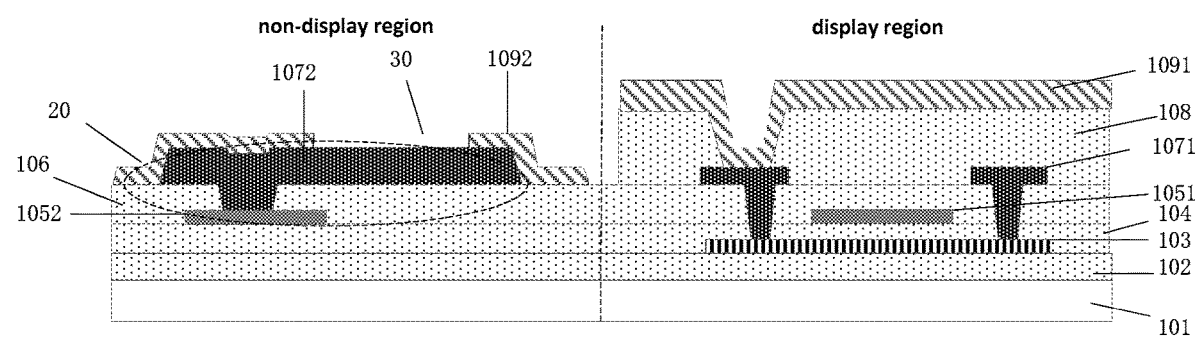
FIG. 3 is yet another schematic view showing the full-reflection display substrate according to one embodiment of the present disclosure.

When the etch stop pattern 1092 includes at least one metal film layer and at least one transparent metal oxide film layer laminated one on another, bonding resistance between the transparent metal oxide film layer and a pin of the driving circuitry is larger than bonding resistance between the bonding pin 20 (the metal film layer) and the pin of the driving circuitry due to large resistance of the transparent metal oxide film layer. Hence, as shown in FIG. 3, the etch stop pattern 1092 is provided with a first via hole 30 to expose a part of the bonding pin 20, and the exposed bonding pin 20 is bonded to the pin of the driving circuitry so as to reduce the bonding resistance.

When the bonding pin 20 includes a plurality of metal film layers, the plurality of metal film layers is coupled to each other through the second via hole in the interlayer dielectric layer between the metal film layers. At this time, the interlayer dielectric layer is depressed to some extent at a position where the second via hole is formed. In order to prevent the bonding from being adversely affected by the depression at the second via hole, the first via hole in the etch stop pattern 1092 needs to be arranged in a flat region of the etch stop pattern 1092, that is, an orthogonal projection of the first via hole onto the base substrate does not overlap an orthogonal projection of the second via hole onto the base substrate, so as to ensure that a region where the bonding pin 20 is exposed is a flat region as possible.

Figure 4:
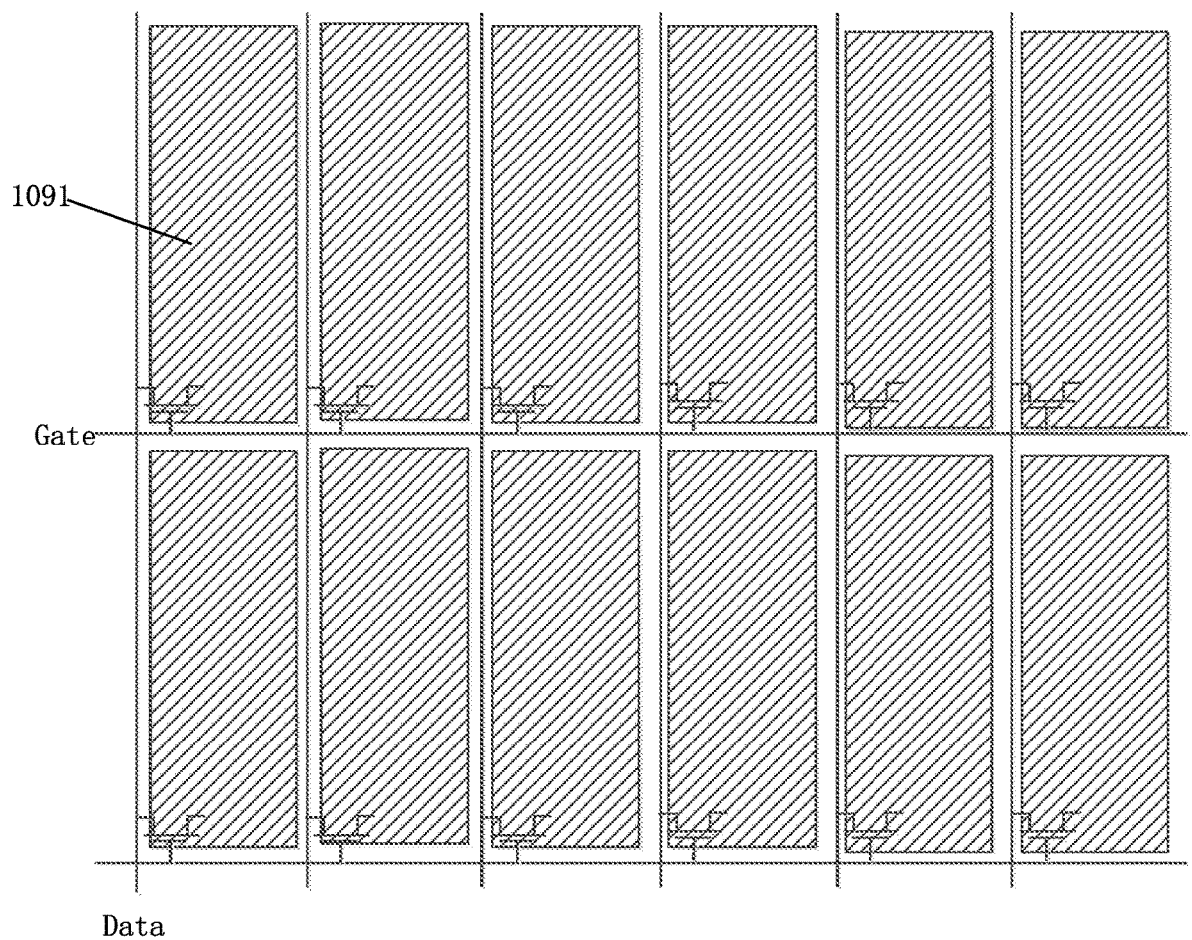
FIG. 4 is a schematic view showing a reflection layer according to one embodiment of the present disclosure.

In the embodiments of the present disclosure, as shown in FIG. 4, the reflection layer is reused as a pixel electrode. In this regard, it is unnecessary to form the reflection layer separately, thereby to reduce the manufacture cost. In addition, due to the reflection layer with a square pattern, it is able to increase a reflection area, thereby to improve reflectivity.

A specific structure of the full-reflection display substrate will be described hereinafter.

As shown in FIG. 3, the full-reflection display substrate includes: the base substrate 101, the base substrate 101 including the display region and the non-display region; a buffer layer 102; an active layer 103 arranged in the display region, the active layer 103 being a low-temperature polysilicon (P—Si) semiconductor layer; a gate insulation layer 104; a gate electrode 1051 arranged in the display region and the first metal layer pattern 1052 arranged in the non-display region, the gate electrode 1051 being arranged at a same layer and made of a same material as the first metal layer pattern 1052; an interlayer dielectric layer 106; a source/drain electrode 1071 arranged in the display region and the second metal layer pattern 1072 arranged in the non-display region, the second metal layer pattern 1072 being arranged at a same layer and made of a same material as the source/drain electrode 1071 and coupled the first metal layer pattern 1052 through the second via hole in the interlayer dielectric layer 106, the first metal layer pattern 1052 and the second metal layer pattern 1072 together forming the bonding pin 20, and the source/drain electrode 1071 and the second metal layer pattern 1072 each being a multi-layered structure consisting of a Ti layer, an Al layer, and a Ti layer; a passivation layer 108; and the reflection layer 1091 arranged in the display region and the etch stop pattern 1092 arranged in the non-display region, the etch stop pattern 1092 being arranged at a same layer and made of a same material as the reflection layer 1091 and covering the bonding pin 20, the reflection layer 1091 and the etch stop pattern 1092 each being a multi-layered structure consisting of an ITO layer, an Ag layer, and an ITO layer, and the etch stop pattern 1092 being provided with the first via hole 30 to expose a part of the bonding pin 20, so that the exposed bonding pin 20 is bonded to a pin of the driving circuitry.

The present disclosure further provides in some embodiments a full-reflection display device, which includes the above-mentioned full-reflection display substrate.

Figure 5:
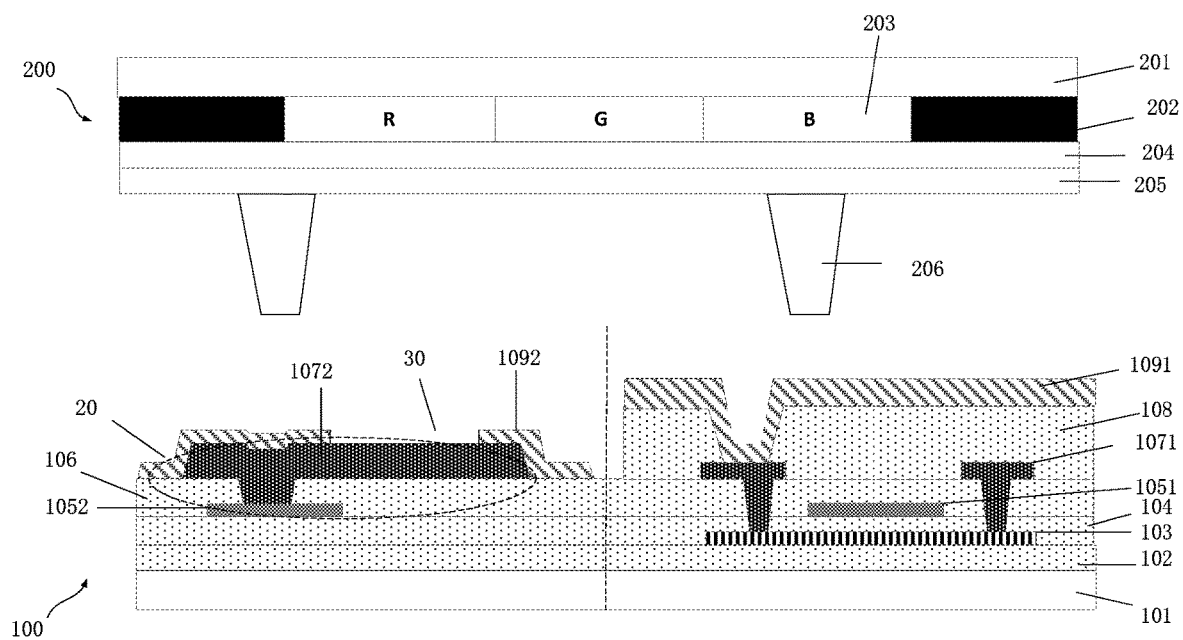
FIG. 5 is a schematic view showing a full-reflection display device according to one embodiment of the present disclosure.

In the embodiments of the present disclosure, as shown in FIG. 5, the full-reflection display device includes a display substrate 100 and a color filter substrate 200. The display substrate 100 is the above-mentioned display substrate in FIG. 2, and thus will not be particularly defined herein.

The color filter substrate 200 includes a base substrate 201, a Black Matrix (BM) 202, a filter layer 203, an Overcoat layer (OC) 204, a common electrode 205 and a post spacer (PS) 206.

In the embodiments of the present disclosure, the display substrate is a Twisted Nematic (TN) display substrate, and in some other embodiments of the present disclosure, the display substrate may be a display substrate of any other type.

The present disclosure further provides in some embodiments a method for manufacturing a full-reflection display substrate which, as shown in FIG. 6A to FIG. 6E, includes the following steps.

Figure 6A:
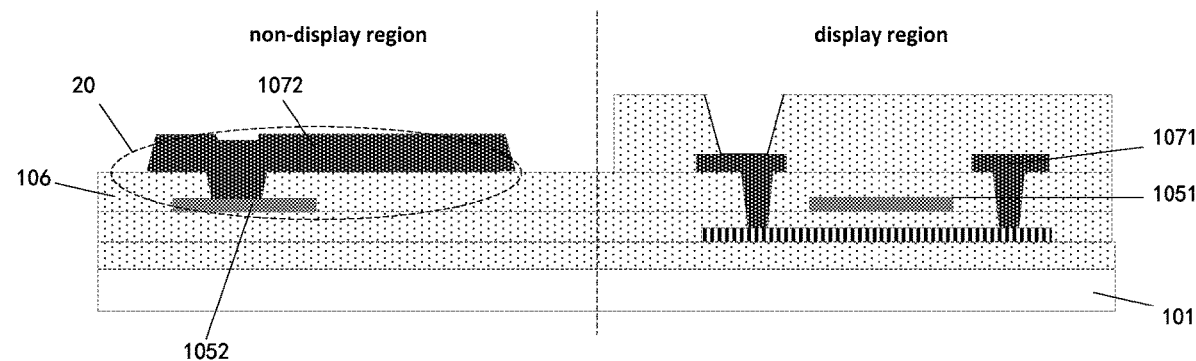
FIGS. 6A to 6F are schematic views showing of the manufacture of the full-reflection display substrate according to one embodiment of the present disclosure.

Step 61: as shown in FIG. 6A, providing a base substrate 101, the base substrate 101 including a display region and a non-display region.

Step 62: as shown in FIG. 6A, forming a signal line (not shown) in the display region and forming a bonding pin 20 in the non-display region.

In the embodiments of the present disclosure, the bonding pin 20 includes one metal film layer or a plurality of metal film layers coupled to each other. For example, the bonding pin 20 includes a first metal layer pattern 1052 and a second metal layer pattern 1072, the first metal layer pattern 1052 and the second metal layer pattern 1072 are coupled to each other through a second via hole in an interlayer dielectric layer between the first metal layer pattern 1052 and the second metal layer pattern 1072. The first metal layer pattern 1052 is a gate metal layer pattern, and it is arranged at a same layer and made of a same material as a gate electrode 1051 in the display region, so that the first metal layer pattern 1052 and the gate electrode 1051 are formed through a single patterning process. The second metal layer pattern 1072 is a source/drain metal layer pattern, and it is arranged at a same layer and made of a same material as a source/drain electrode 1071 in the display region, so that the second metal layer pattern 1072 and the source/drain electrode 1071 are formed through a single patterning process. The signal line is arranged at a same layer and made of a same material as the first metal layer pattern 1052 and the gate electrode 1051, in the case that the signal line is a gate line. The signal line is arranged at a same layer and made of a same material as the second metal layer pattern 1072 and the source/drain electrode 1071, in the case that the signal line is a data line.

Figure 6B:
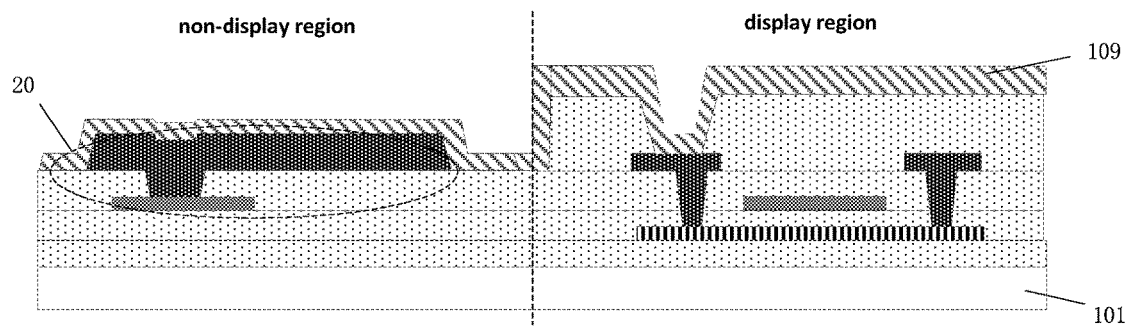

Step 63: as shown in FIG. 6B, forming a first conductive film layer 109 on the base substrate 101, the first conductive film layer 109 covering the display region and the non-display region.

In the embodiments of the present disclosure, the first conductive film layer 109 is used to form a reflection layer arranged in the display region, and a wet-etching process needs to be used during the formation of the reflection layer.

The reflection layer may be a pixel electrode or any other pattern that needs to be formed through the wet-etching process.

Figure 6C:
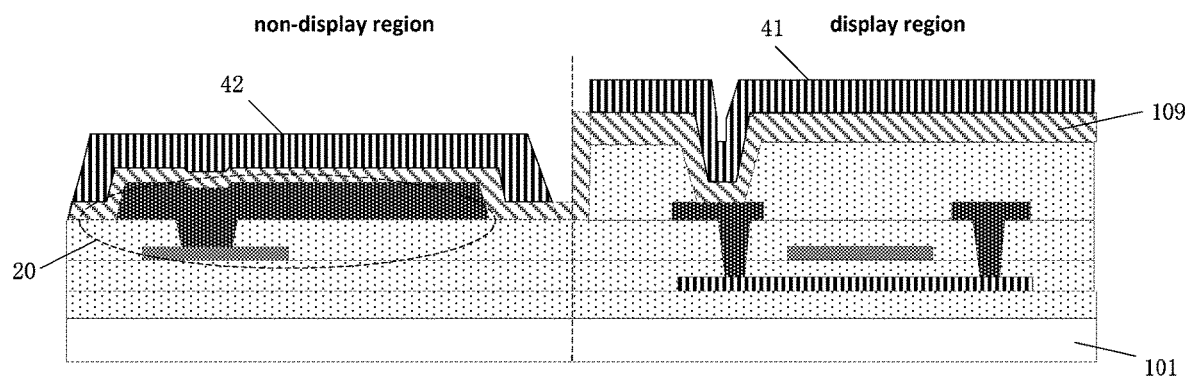

Step 64: as shown in FIG. 6C, forming a first photoresist pattern 41 and a second photoresist pattern 42 on the first conductive film layer 109, the first photoresist pattern 41 being arranged in the display region, and the second photoresist pattern 42 being arranged in the non-display region.

Figure 6D:
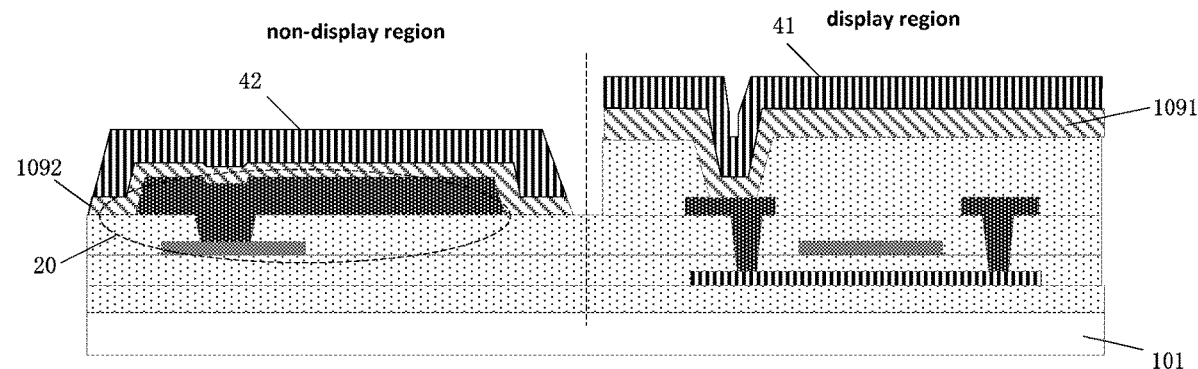

Step 65: as shown in FIG. 6D, wet-etching the first conductive film layer 109 with the first photoresist pattern 41 and the second photoresist pattern 42 as masks to obtain the reflection layer 1091 and an etch stop pattern 1092, the reflection layer 1091 being arranged in the display region, and the etch stop pattern 1092 being arranged in the non-display region and at least covering a side surface of the bonding pin 20 (in the embodiments of the present disclosure, the bonding pin 20 is completely covered).

In the embodiments of the present disclosure, a photoresist above the bonding pin 20 is reserved, so when the first conductive film layer 109 is wet-etched, the bonding pin 20 is protected by the photoresist above the bonding pin 20 and the first conductive film layer 109, so it is able to prevent the bonding pin 20 from being etched by an etching solution.

Figure 6E:
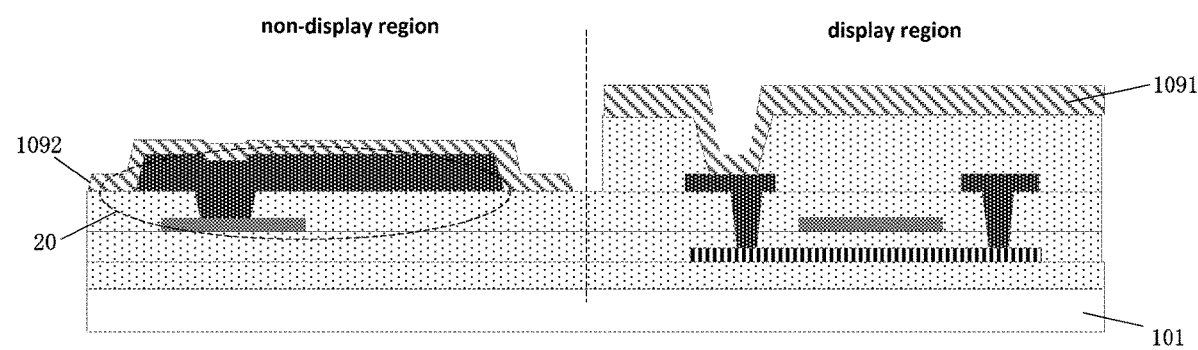

Step 66: as shown in FIG. 6E, removing the first photoresist pattern 41 and the second photoresist pattern 42.

In the embodiments of the present disclosure, when the first conductive film layer for forming the reflection layer in the display region is wet-etched, the first conductive film layer at least on the side surface of the bonding pin is reserved as the etch stop pattern, so as to prevent the bonding pin 20 from being etched. At the same time, the etch stop pattern and the reflection layer are formed through a single patterning process, so it is unnecessary to provide any additional process and any additional masks during the manufacture of the display substrate.

In the embodiments of the present disclosure, the second metal layer pattern 1072 includes one metal film layer or a plurality of metal film layers laminated one on another. For example, the second metal layer pattern 1072 is a multi-layered structure consisting of a Ti layer, an Al layer, and a Ti layer. The Al layer is easily oxidized and the Ti layer is hard to be oxidized. In this regard, when the Ti layers are arranged at two sides of the Al layer respectively, it is able to prevent the Al layer from being oxidized.

In the embodiments of the present disclosure, each of the reflection layer 1091 and the etch stop pattern 1092 includes at least one metal film layer and at least one transparent metal oxide film layer laminated one on another, and the transparent metal oxide film layer is used to prevent the metal film layer from being oxidized. Furthermore, the etch stop pattern includes a first transparent metal oxide film layer, a metal film layer and a second transparent metal oxide film layer laminated one on another, that is, the transparent metal oxide film layers are arranged at two sides of the metal film layer respectively, so as to prevent the metal film layer from being oxidized in a better manner. For example, each of the reflection layer 1091 and the etch stop pattern 1092 may be a multi-layered structure consisting of an ITO layer, an Ag layer and an ITO layer. The Ag layer is easily oxidized, and when the ITO layers are arranged on and under the Ag layer, it is able to effectively prevent the Ag layer from being oxidized.

In the case that the second metal layer pattern 1072 is a multi-layered structure consisting of a Ti layer, an Al layer, and a Ti layer, the reflection layer 1091 is a multi-layered structure consisting of an ITO layer, an Ag layer, and an ITO layer, and no etch stop pattern 1092 is provided, the Al layer at an edge of the second metal layer pattern 1072 may be etched during the formation of the reflection layer 1091, and the Al layer may be seriously hollowed out, so there is a relatively large risk for the top Ti layer to be peeled off After the Ti layer has been peeled off, the Al layer may be exposed to the outside and thereby easily oxidized, resistance of the oxidized Al layer may increase, and the bonding resistance may increase too. As a result, data transmission may be adversely affected, and thereby a display defect may occur.

In the embodiments of the present disclosure, at least the side surface of the bonding pin 20 is covered with the etch stop pattern 1092, so as to prevent the bonding pin 20 from being etched.

Figure 6F:
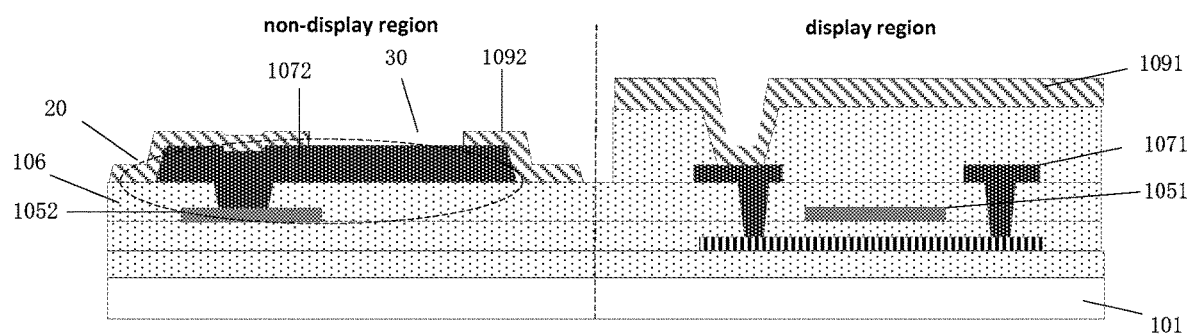

When the etch stop pattern 1092 includes at least one metal film layer and at least one transparent metal oxide film layer laminated one on another, bonding resistance between the transparent metal oxide film layer and a pin of the driving circuitry is larger than the bonding resistance between the bonding pin 20 (the metal film layer) and the pin of the driving circuitry due to large resistance of the transparent metal oxide film layer. In the embodiments of the present disclosure, as shown in FIG. 6F, subsequent to obtaining the reflection layer and the etch stop pattern, the method further includes forming a first via hole 30 in the etch stop pattern to expose a part of the bonding pin 20.

When the bonding pin 20 includes a plurality of metal film layers, the plurality of metal film layers is coupled to each other through the second via hole in the interlayer dielectric layer between the metal film layers. At this time, the interlayer dielectric layer is depressed to some extent at a position where the second via hole is formed. In order to prevent the bonding from being adversely affected by the depression at the second via hole, the first via hole in the etch stop pattern 1092 needs to be arranged in a flat region of the etch stop pattern 1092, that is, an orthogonal projection of the first via hole onto the base substrate does not overlap an orthogonal projection of the second via hole onto the base substrate, so as to ensure that a region where the bonding pin 20 is exposed is a flat region as possible. In other words, the forming the first via hole in the etch stop pattern includes forming the first via hole in a flat region of the etch stop pattern.

In the embodiments of the present disclosure, the reflection layer is reused as a pixel electrode. In this regard, it is unnecessary to form the reflection layer separately, so as to reduce the manufacture cost. In addition, due to the reflection layer with a square pattern, it is able to increase a reflection area and improve reflectivity.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A full-reflection display substrate, comprising:
a base substrate, the base substrate including a display region and a non-display region;
a signal line arranged in the display region;
a bonding pin arranged in the non-display region, coupled to the signal line and bonded to a driving circuitry;
a reflection layer arranged in the display region; and
an etch stop pattern arranged at a same layer and made of a same material as the reflection layer, arranged in the non-display region, and at least covering a side surface of the bonding pin;
wherein the reflection layer is reused as a pixel electrode.

2. The full-reflection display substrate according to claim 1, wherein the etch stop pattern completely covers the bonding pin.

3. The full-reflection display substrate according to claim 1, wherein each of the reflection layer and the etch stop pattern includes at least one metal film layer and at least one transparent metal oxide film layer laminated one on another.

4. The full-reflection display substrate according to claim 3, wherein the etch stop pattern is provided with a first via hole to expose a part of the bonding pin.

5. The full-reflection display substrate according to claim 1, wherein the etch stop pattern is provided with a first via hole to expose a part of the bonding pin.

6. The full-reflection display substrate according to claim 5, wherein the first via hole is arranged in a flat region of the etch stop pattern.

7. The full-reflection display substrate according to claim 6, wherein the bonding pin includes a first metal layer pattern and a second metal layer pattern, the first metal layer pattern and the second metal layer pattern are coupled to each other through a second via hole in an interlayer dielectric layer between the first metal layer pattern and the second metal layer pattern, and an orthogonal projection of the first via hole onto the base substrate does not overlap an orthogonal projection of the second via hole onto the base substrate.

8. A full-reflection display device, comprising the full-reflection display substrate according to claim 1.

9. A method for manufacturing a full-reflection display substrate, comprising: providing a base substrate, the base substrate including a display region and a non-display region; forming a signal line in the display region and forming a bonding pin in the non-display region, the bonding pin being coupled to the signal line and bonded to a driving circuitry; forming a first conductive film layer on the base substrate, the first conductive film layer covering the display region and the non-display region; forming a first photoresist pattern and a second photoresist pattern on the first conductive film layer, the first photoresist pattern being arranged in the display region, and the second photoresist pattern being arranged in the non-display region; wet-etching the first conductive film layer with the first photoresist pattern and the second photoresist pattern as masks to obtain a reflection layer and an etch stop pattern, the reflection layer being arranged in the display region, and the etch stop pattern being arranged in the non-display region and at least covering a side surface of the bonding pin; and removing the first photoresist pattern and the second photoresist pattern;

wherein the reflection layer is reused as a pixel electrode.

10. The method according to claim 9, wherein subsequent to obtaining the reflection layer and the etch stop pattern, the method further includes forming a first via hole in the etch stop pattern to expose a part of the bonding pin.

11. The method according to claim 10, wherein the forming the first via hole in the etch stop pattern includes forming the first via hole in a flat region of the etch stop pattern.

* * * * *

UNITED STATES PATENT AND TRADEMARK OFFICE
CERTIFICATE OF CORRECTION

Page 1 of 1

PATENT NO. : 12,310,104 B2
APPLICATION NO. : 17/624878
DATED : May 20, 2025
INVENTOR(S) : Jiguo Wang et al.

It is certified that error appears in the above-identified patent and that said Letters Patent is hereby corrected as shown below:

On the Title Page

Item (73) should read:
(73) Assignee: BOE Technology Group Co., Ltd., Beijing (CN)

Signed and Sealed this
Twenty-ninth Day of July, 2025

Coke Morgan Stewart
*Acting Director of the United States Patent and Trademark Office*